United States Patent
Hanihara

(10) Patent No.: US 9,912,255 B2
(45) Date of Patent: Mar. 6, 2018

(54) ELECTROSTATIC ACTUATOR, VARIABLE CAPACITANCE CAPACITOR, ELECTRIC SWITCH, AND METHOD FOR DRIVING ELECTROSTATIC ACTUATOR

(75) Inventor: Koji Hanihara, Kanagawa (JP)

(73) Assignees: PIONEER CORPORATION, Kanagawa (JP); PIONEER MICRO TECHNOLOGY CORPORATION, Yamanashi (JP)

(*) Notice: Subject to any disclaimer, the term of this patent is extended or adjusted under 35 U.S.C. 154(b) by 436 days.

(21) Appl. No.: 14/391,433

(22) PCT Filed: Apr. 9, 2012

(86) PCT No.: PCT/JP2012/002466
§ 371 (c)(1),
(2), (4) Date: Dec. 1, 2014

(87) PCT Pub. No.: WO2013/153566
PCT Pub. Date: Oct. 17, 2013

(65) Prior Publication Data
US 2015/0116893 A1     Apr. 30, 2015

(51) Int. Cl.
*H01G 5/16*     (2006.01)
*H02N 1/00*     (2006.01)
(Continued)

(52) U.S. Cl.
CPC ............ *H02N 1/006* (2013.01); *B81B 3/001* (2013.01); *H01G 5/16* (2013.01); *H01H 59/00* (2013.01);
(Continued)

(58) Field of Classification Search
CPC   H01G 5/001; H01G 5/16; H01G 5/14; H01G 5/013; H01G 5/04; H01G 5/38;
(Continued)

(56) References Cited

U.S. PATENT DOCUMENTS 6,376,787 B1 * 4/2002 Martin .............. H01H 59/0009
200/181
6,635,919 B1 * 10/2003 Melendez ............... H01G 5/16
200/181
(Continued)

FOREIGN PATENT DOCUMENTS

| JP | 2004-172504 | 6/2004 |
| JP | 2007-287468 | 11/2007 |
| JP | 2009-075209 | 4/2009 |

OTHER PUBLICATIONS

International Search Report PCT/JP2012/002466 dated Jul. 3, 2012.

*Primary Examiner* — Nguyen Ha
(74) *Attorney, Agent, or Firm* — Young & Thompson

(57) ABSTRACT

An electrostatic actuator includes: a fixed driving electrode that is disposed on a silicon substrate; a movable driving electrode that is disposed so as to face the fixed driving electrode and approaches the fixed driving electrode with an electrostatic force generated between the movable driving electrode and the fixed driving electrode; and a pair of spacers that comes in contact with the movable driving electrode in an approaching state in which the fixed driving electrode and the movable driving electrode approach each other and forms a prescribed air gap between the fixed driving electrode and the movable driving electrode, wherein each of the spacers has a spacer electrode portion that comes in contact with the movable driving electrode via an insulator and has the same potential as one of the electrodes at least in the approaching state.

10 Claims, 7 Drawing Sheets

(51) Int. Cl.
*B81B 3/00* (2006.01)
*H01H 59/00* (2006.01)

(52) U.S. Cl.
CPC .............. *B81B 2201/0221* (2013.01); *H01H 2059/0072* (2013.01)

(58) Field of Classification Search
CPC ......... H01L 29/84; H01L 21/50; H01L 21/02; H01L 27/108
See application file for complete search history.

(56) References Cited

U.S. PATENT DOCUMENTS

| | | | |
|---|---|---|---|
| 9,162,868 B2* | 10/2015 | Kolb | B81B 3/0021 |
| 2003/0179535 A1* | 9/2003 | Shimanouchi | H01G 5/16 361/278 |
| 2004/0214543 A1* | 10/2004 | Osone | H01G 5/16 455/197.2 |
| 2010/0019616 A1* | 1/2010 | Naruse | H02N 1/006 310/300 |
| 2010/0139065 A1* | 6/2010 | Sahm | B23Q 16/102 29/39 |
| 2013/0335878 A1* | 12/2013 | Khieu | H01G 5/16 361/290 |

* cited by examiner

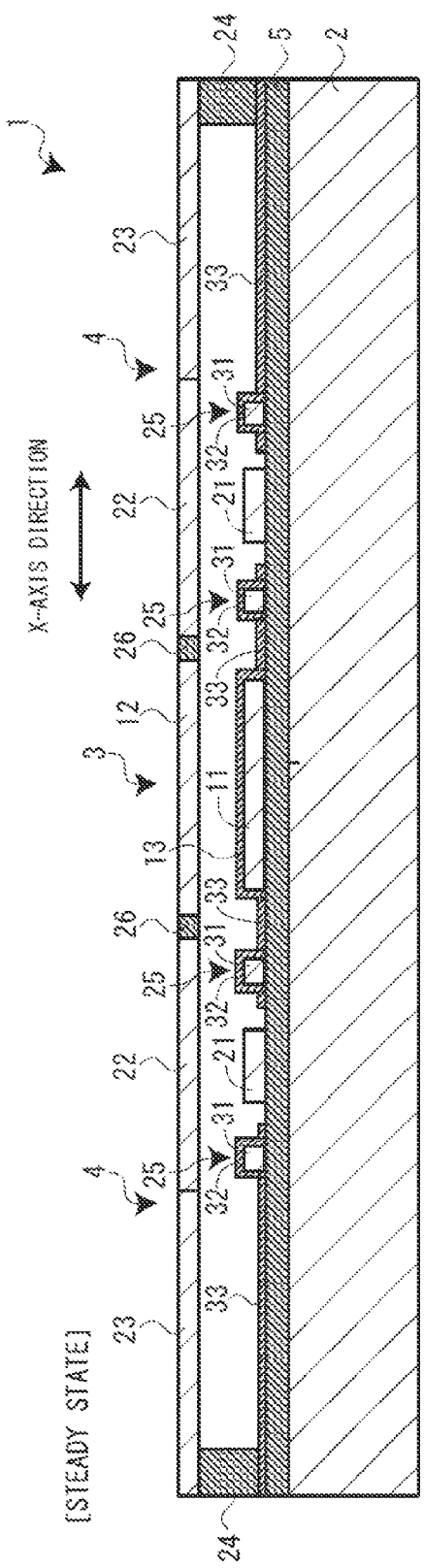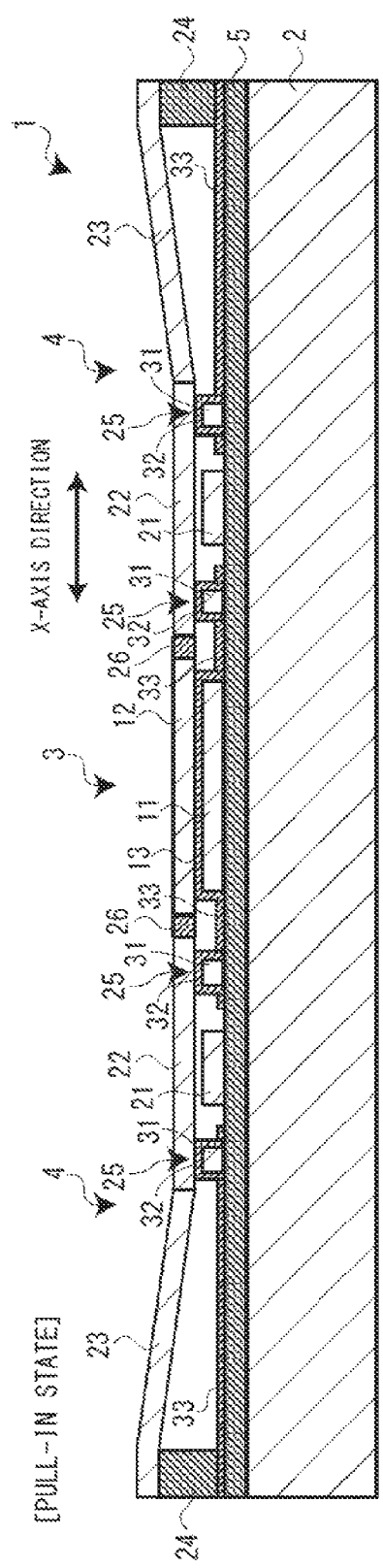
FIG. 1A
FIG. 1B

F I G. 4 A
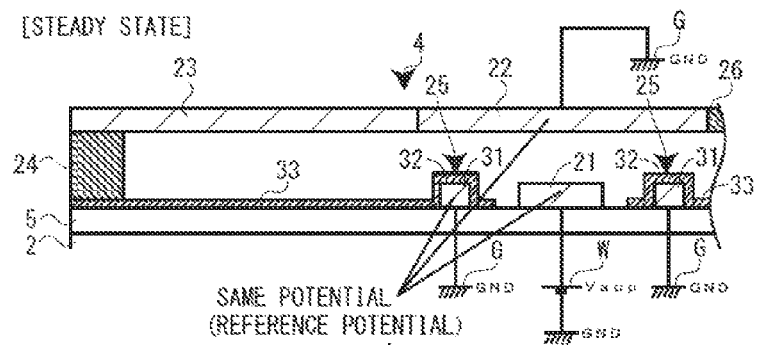
F I G. 4 B
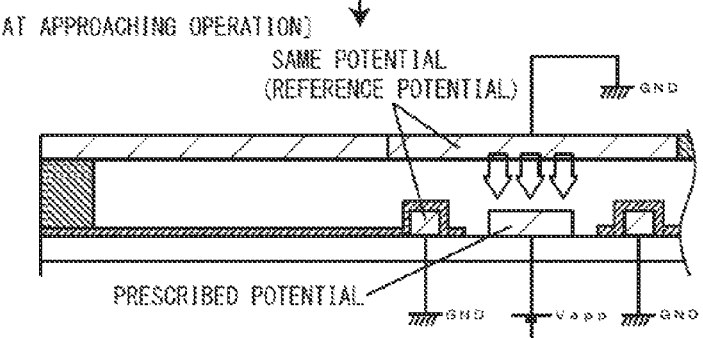
F I G. 4 C
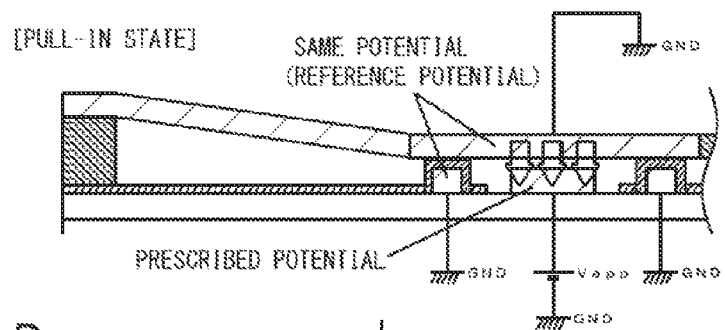
F I G. 4 D
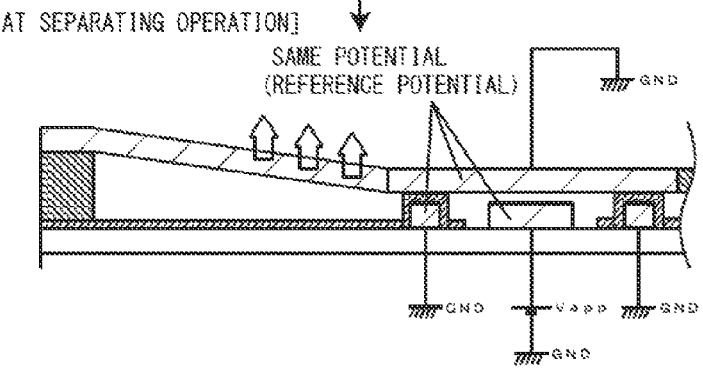

ELECTROSTATIC ACTUATOR, VARIABLE CAPACITANCE CAPACITOR, ELECTRIC SWITCH, AND METHOD FOR DRIVING ELECTROSTATIC ACTUATOR

TECHNICAL FIELD

The present invention relates to an electrostatic actuator that has a fixed electrode and a movable electrode facing the fixed electrode and causes the movable electrode to approach and separate from the fixed electrode with an electrostatic force, a variable capacitance capacitor, an electric switch, and a method for driving the electrostatic actuator.

BACKGROUND ART

A known variable capacitance capacitor has a variable capacitance portion composed of a signal line and an electrode facing the signal line and a pair of actuator portions of a bridge structure in line with both sides of the variable capacitance portion (see Patent Document 1). Each of the actuator portions has a movable-side upper electrode and a fixation-side lower electrode facing the upper electrode. Further, when a voltage is applied between the upper electrode and the lower electrode, a potential difference is caused between the upper electrode and the lower electrode. As a result, an electrostatic force is generated between the upper electrode and the lower electrode, whereby the upper electrode and the lower electrode are caused to approach each other. In addition, the lower electrode is covered with an insulating film, and the upper electrode and the lower electrode come in contact with each other via the insulating film over the almost entire areas thereof in an approaching state in which both of the electrodes approach each other.

[Patent Document 1] JP-A-2008-278634

DISCLOSURE OF THE INVENTION

Problems that the Invention is to Solve

Under such a conventional configuration, however, both of the electrodes come in contact with each other via the insulating film over the almost entire surfaces thereof in the approaching state. Therefore, charges are accumulated on the insulating film (charging) when the approaching state goes on for a long time or when the approaching operation is performed multiple times. As a result, the upper electrode and the lower electrode adhere to each other due to the charges accumulated on the insulating film. That is, it gives rise to the problem that stiction (sticking) is caused.

In response to this problem, for example, when it is simply configured such that a spacer formed of an insulator is disposed on a substrate and the upper electrode comes in contact with the spacer in the approaching state to generate a prescribed air gap (air space) between the upper electrode and the lower electrode, charges are accumulated on the spacer itself as the insulator to cause stiction. In particular, when the spacer is disposed on a semiconductor substrate, positive and negative charges are accumulated between the upper electrode and the semiconductor substrate as in a capacitor. As a result, charges are accumulated on the spacer.

The present invention has an object of providing an electrostatic actuator capable of preventing stiction with a simple configuration, a variable capacitance capacitor, an electric switch, and a method for driving the electrostatic actuator.

Means for Solving the Problems

The present invention provides an electrostatic actuator comprising: a fixed electrode that is disposed on a substrate; a movable electrode that is disposed so as to face the fixed electrode and approaches the fixed electrode with an electrostatic force generated between the movable electrode and the fixed electrode; and a spacer that comes in contact with one of the fixed electrode and the movable electrode in an approaching state in which the fixed electrode and the movable electrode approach each other and forms a prescribed air gap between the fixed electrode and the movable electrode, wherein the spacer has a spacer electrode portion that comes in contact with the one electrode via an insulator and has the same potential as the one electrode at least in the approaching state.

According to this configuration, the spacer electrode portion of the spacer (stopper) comes in contact with the one electrode via the insulator and generates the prescribed air gap between the fixed electrode and the movable electrode. At this time, since the spacer electrode portion has the same potential as the one electrode, positive and negative charges are not accumulated (an electric field is not generated) between the one electrode and the spacer electrode portion. As a result, charges are not accumulated on the insulator interposed between the one electrode and the spacer electrode portion. As described above, charges are not accumulated on the spacer itself as well as both of the electrodes, and thus stiction can be prevented by the simple configuration. Note that the fixed electrode and the spacer electrode portion are caused to become nonconductive by the configuration.

In this case, the one electrode and the spacer electrode portion are preferably connected to a reference potential point, and the other of the fixed electrode and the movable electrode is preferably connected to an application power supply that applies a prescribed pull-in operating voltage to generate the electrostatic force.

If the pull-in operating voltage is applied to the one electrode to cause the spacer electrode portion to have the same potential as the one electrode, the pull-in operating voltage is also required to be applied to the spacer electrode portion. This results in the potential control of the electrostatic actuator being complex.

In response to this problem, since the pull-in operating voltage is applied to the other electrode according to the above configuration, the potential of the one electrode does not change and the voltage is not required to be applied to the spacer electrode portion. Accordingly, the potential control can be easily performed. Note that the "prescribed pull-in operating voltage" is a voltage greater than or equal to a voltage (i.e., pull-in voltage) at which the movable electrode is caused to approach (pull in) by the electrostatic force.

In addition, the spacer is preferably disposed on the substrate and comes in contact with the movable electrode in the approaching state to form the prescribed air gap, and the fixed electrode and the spacer electrode portion are preferably formed to have the same height.

According to this configuration, since the film thicknesses of the fixed electrode and the spacer electrode portion are made the same, the fixed electrode and the spacer electrode portion can be formed in an integrated process when the electrostatic actuator is manufactured by the process technology of MEMS (Micro Electro Mechanical Systems).

Moreover, the fixed electrode and the movable electrode preferably face each other at exposed parts thereof.

When the fixed electrode and the movable electrode face each other at a part covered with an insulating film, there is a likelihood that charges are accumulated on the insulating film by the electric field generated between both of the electrodes even if the air gap is formed between both of the electrodes.

In response to this problem, since the fixed electrode and the movable electrode face each other at the exposed parts thereof (parts exposed to the air gap), stiction can be more reliably prevented with the avoidance of the accumulation of charges.

The present invention provides a variable capacitance capacitor comprising: the above electrostatic actuator; and a variable capacitance element that varies an electrostatic capacitance using the electrostatic actuator as a driving source.

According to this configuration, the variable capacitance capacitor high in safety can be provided by the use of the electrostatic actuator capable of preventing stiction.

The present invention provides an electric switch comprising: the above electrostatic actuator; and a switch element that switch-drives using the electrostatic actuator as a driving source.

According to this configuration, the electric switch high in safety can be provided by the use of the electrostatic actuator capable of preventing stiction.

The present invention provides a method for driving an electrostatic actuator, the electrostatic actuator including: a fixed electrode that is disposed on a substrate; a movable electrode that is disposed so as to face the fixed electrode and approaches the fixed electrode with an electrostatic force generated between the movable electrode and the fixed electrode; and a spacer that has a spacer electrode portion that comes in contact with one of the fixed electrode and the movable electrode via an insulator in an approaching state in which the fixed electrode and the movable electrode approach each other and forms a prescribed air gap between the fixed electrode and the movable electrode, wherein the one electrode and the spacer electrode portion are connected to a reference potential point, and a prescribed pull-in operating voltage to generate the electrostatic force is applied to the other of the fixed electrode and the movable electrode.

According to this configuration, the spacer electrode portion has the same potential as the one electrode when the one electrode and the spacer electrode portion are connected to a reference potential point. Thus, positive and negative charges are not accumulated (an electric field is not generated) between the one electrode and the spacer electrode portion. As a result, charges are not accumulated on the insulator interposed between the one electrode and the spacer electrode portion. As described above, charges are not accumulated on the spacer itself as well as both of the electrodes, and thus stiction can be prevented by the simple configuration. In addition, since the pull-in operating voltage is applied to the other electrode, the potential of the one electrode does not change and the voltage is not required to be applied to the spacer electrode portion. Accordingly, the potential control can be easily performed.

BRIEF DESCRIPTION OF THE DRAWINGS

FIGS. 1A and 1B are cross-sectional views of a variable capacitance capacitor according to an embodiment;

FIGS. 4A to 4D are explanatory views showing the approaching and separating operations of both driving electrodes in the electrostatic actuator;

DESCRIPTION OF EXEMPLARY EMBODIMENTS

First Embodiment

Hereinafter, a description will be given, with reference to the accompanying drawings, of an electrostatic actuator, a variable capacitance capacitor, and an electric switch according to an embodiment of the present invention. A first embodiment exemplifies a variable capacitance capacitor using electrostatic actuators. The variable capacitance capacitor is a MEMS (Micro Electro Mechanical Systems) device and configured in such a way that an electronic circuit and a mechanical structure are installed on a silicon substrate (semiconductor substrate) using a semiconductor integrated circuit manufacturing technology. Note that the variable capacitance capacitor has a structure to prevent stiction in the electrostatic actuators with spacers and potential control.

Figure 2:
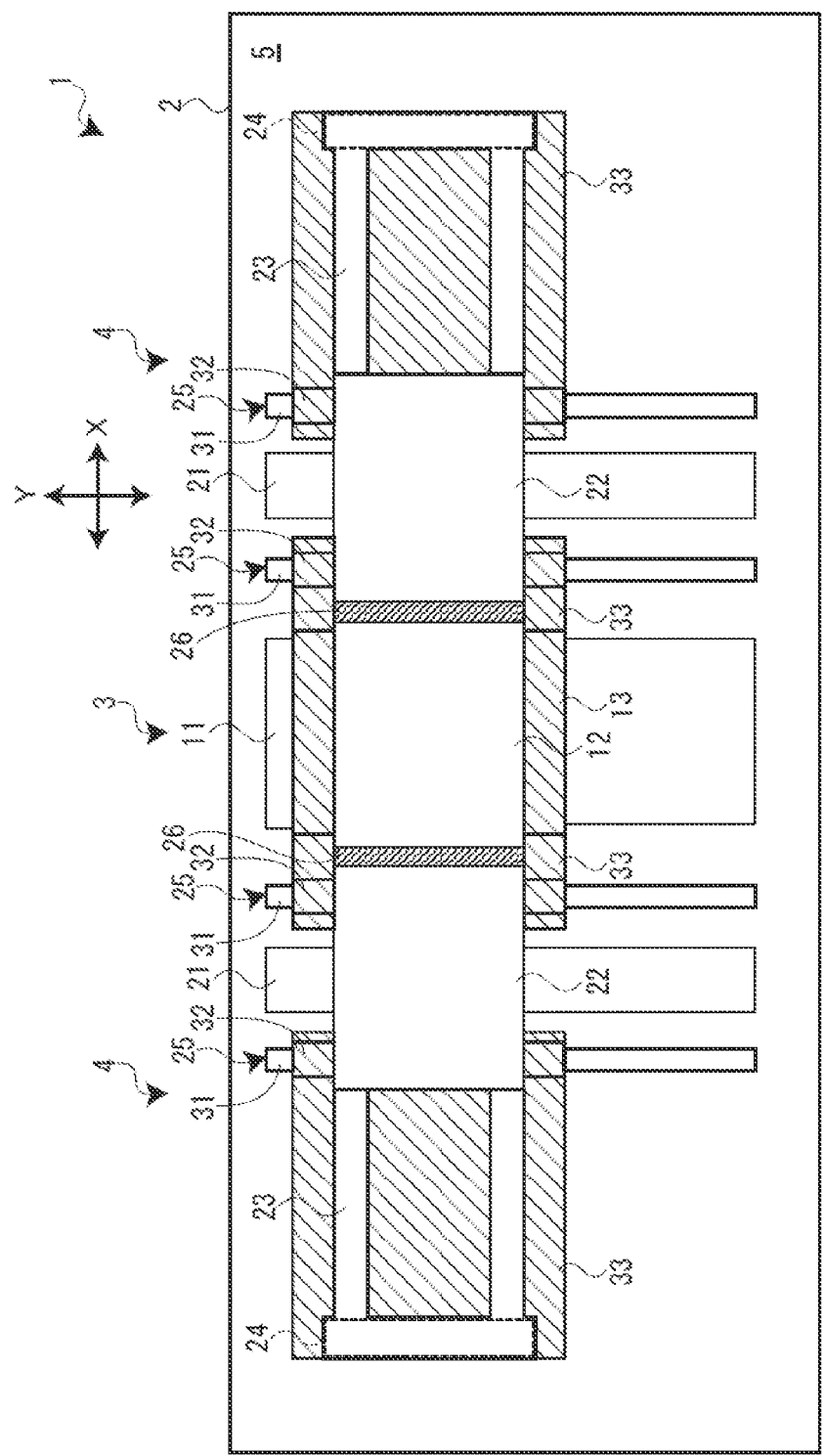
FIG. 2 is a plan view of the variable capacitance capacitor.

As shown in FIGS. 1A and 1B and FIG. 2, a variable capacitance capacitor 1 has a silicon substrate (substrate) 2, a variable capacitance element 3 that is disposed on the silicon substrate 2, and a pair of electrostatic actuators 4 that is disposed on the silicon substrate 2 and coupled to both sides of the variable capacitance element 3. That is, the variable capacitance capacitor 1 varies the electrostatic capacitance of the variable capacitance element 3 using the pair of electrostatic actuators 4 as a driving source. In addition, an insulating layer 5 is formed on the front surface of the silicon substrate 2, and the variable capacitance element 3 and the pair of electrostatic actuators 4 are disposed on the insulating layer 5. Note that the embodiment defines a direction, in which the pair of electrostatic actuators 4 is coupled to the variable capacitance element 3, as an X-axis direction and defines a direction orthogonal to it as a Y-axis direction.

The variable capacitance element 3 has a fixation-side fixed capacitance electrode 11 that is laid on the silicon substrate 2 and a movable-side movable capacitance electrode 12 that faces the fixed capacitance electrode 11 from above. In addition, both of the capacitance electrodes 11 and 12 have the respective electric contacts (input terminals) of the variable capacitance element 3, and charges are accumulated on both of the capacitance electrodes 11 and 12 by the application of a voltage. Further, the electrostatic actuators 4 cause the movable capacitance electrode 12 to approach or separate from the fixed capacitance electrode 11 to vary the electrostatic capacitance of the variable capacitance element 3 in two stages. In addition, the fixed capacitance electrode 11 is covered with an insulating film 13, and the fixed capacitance electrode 11 and the movable capacitance electrode 12 come in contact with each other via the insulating film 13 in an approaching state in which both of the capacitance electrodes 11 and 12 approach each other. Note that although the embodiment shows a case in which the fixed capacitance electrode 11 and the movable capacitance electrode 12 come in contact with each other via the insulating film 13 in the approaching state in which both of the capacitance electrodes 11 and 12 approach each other, it may be configured such that the fixed capacitance electrode 11 and the movable capacitance electrode 12 face each other via an air gap in the approaching state.

Figure 3:
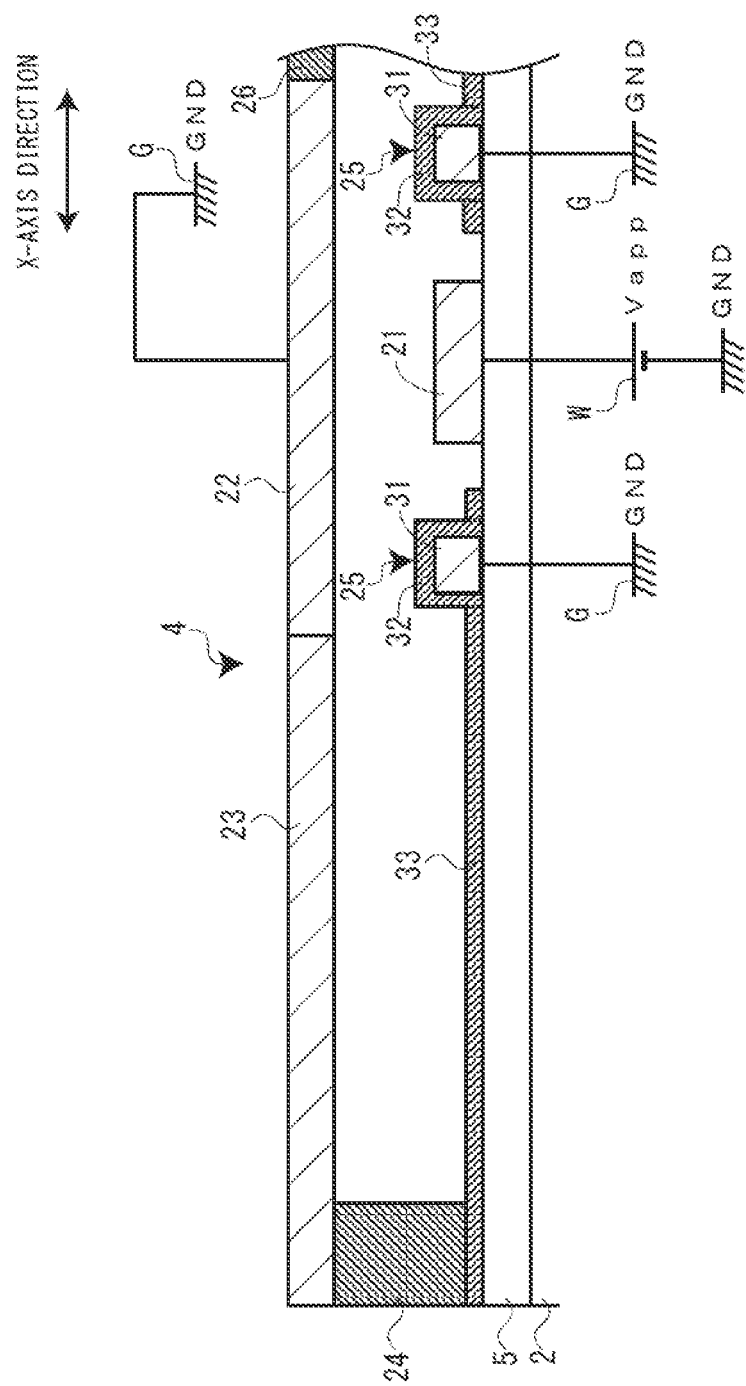
FIG. 3 is a cross-sectional view of an electrostatic actuator.

As shown in FIGS. 2 and 3, each of the electrostatic actuators 4 has a fixation-side fixed driving electrode (fixed electrode) 21 that is laid on the silicon substrate 2, a movable-side movable driving electrode (movable electrode) 22 that faces the fixed driving electrode 21 from above, a beam 23 that supports one end (side opposite to the side of the variable capacitance element 3) of the movable driving electrode 22 in the X-axis direction with elasticity (spring property), an anchor 24 that supports the base end of the beam 23 and is disposed to stand on the silicon substrate 2, and a pair of spacers 25 that is disposed to stand on the silicon substrate 2 and controls the movable driving electrode 22 to maintain a prescribed air gap (air space) between the fixed driving electrode 21 and the movable driving electrode 22.

The movable driving electrode 22 is supported by the beam 23 and the anchor 24 so as to freely approach and separate from the fixed driving electrode 21 and faces the fixed driving electrode 21 and the pair of spacers 25. That is, the movable driving electrode 22 has a length enough to cover the fixed driving electrode 21 and the pair of spacers 25 in the X-axis direction. In addition, the movable driving electrode 22 is coupled to the movable capacitance electrode 12 via a coupling portion as an insulator at one end thereof in the X-axis direction. That is, the movable capacitance electrode 12 is coupled to the pair of movable driving electrodes 22 of the pair of electrostatic actuators 4 on both sides thereof in the X-axis direction (see FIG. 1). Thus, the movable capacitance electrode 12 integrally moves with the pair of movable driving electrodes 22 to perform approaching and separating operations. Moreover, the movable driving electrode 22 is connected to ground (reference potential point) G and has reference potential (zero potential) at all times.

The fixed driving electrode 21 is laid on the silicon substrate 2 and faces the movable driving electrode 22. The fixed driving electrode 21 is connected to an application power supply W that applies a prescribed pull-in operating voltage (prescribed driving voltage) and caused to generate an electrostatic force (electrostatic attraction force) between the fixed driving electrode 21 and the movable driving electrode 22 by the application of the prescribed pull-in operating voltage. By the electrostatic force, the movable driving electrode 22 is caused to approach the fixed driving electrode 21. Note that the prescribed pull-in operating voltage is a voltage greater than or equal to a voltage (i.e., pull-in voltage) at which the movable driving electrode 22 is caused to approach (pull in) the fixed driving electrode 21 by the electrostatic force.

The pair of spacers 25 is laid on the silicon substrate 2 in a state of being adjacent to the fixed driving electrode 21 and extending in the Y-axis direction and faces the movable driving electrode 22. In addition, the pair of spacers 25 is disposed so as to sandwich the fixed driving electrode 21 therebetween in the X-axis direction and comes in contact with both ends of the movable driving electrode 22 in the X-axis direction to support the same when the movable driving electrode 22 approaches the fixed driving electrode 21. Thus, the pair of spacers 25 forms the prescribed air gap between the fixed driving electrode 21 and the movable driving electrode 22 in the approaching state in which both of the driving electrodes 21 and 22 approach each other.

Each of the spacers 25 has a spacer electrode portion 31 that is laid on the silicon substrate 2 and an insulator portion 32 that is formed of an insulator and covers the spacer electrode portion 31. Further, the spacer electrode portion 31 comes in contact with the movable driving electrode 22 via the insulator portion 32 in the approaching state in which both of the driving electrodes 21 and 22 approach each other. In addition, the spacer electrode portion 31 is connected to the ground G and has reference potential (zero potential) at all times. That is, the spacer electrode portion 31 and the movable driving electrode 22 have the same potential at all times. Note that the spacer electrode portion 31, the fixed capacitance electrode 11, and the fixed driving electrode 21 are formed of the same material (e.g., polysilicon or the like) and formed to have the same height.

The insulator portion 32 is formed of an insulating film 33 that covers the spacer electrode portion 31. The insulating film 33 that covers the spacer electrode portion 31 on the side of the variable capacitance element 3 extends on the silicon substrate 2 from the periphery of the spacer electrode portion 31 to the fixed capacitance electrode 11 and is integrally formed with the insulating film 13 that covers the fixed capacitance electrode 11 (see FIGS. 1A and 1B). On the other hand, the insulating film 33 that covers the spacer electrode portion 31 on a side opposite to the side of the variable capacitance element 3 extends on the silicon substrate 2 from the periphery of the spacer electrode portion 31 to the anchor 24 and is interposed between the anchor 24 and the insulating layer 5. That is, in a strict sense, the anchor 24 is disposed to stand on the silicon substrate 2 via the insulating layer 5 and the insulating film 33. Note that the insulating film 33 is formed so as to pass over the fixed driving electrode 21 and the fixed driving electrode 21 and the movable driving electrode 22 face each other at the exposed parts thereof (parts exposed to the air gap).

Here, a description will be given, with reference to FIGS. 4A to 4D, of the approaching and separating operations of both of the driving electrodes 21 and 22 in the electrostatic actuator 4. Note that FIGS. 4A to 4D show only one of the electrostatic actuators 4. In addition, the approaching operation starts from a steady state in which both of the driving electrodes 21 and 22 separate from each other, and the separating operation starts from a pull-in state in which both of the driving electrodes 21 and 22 approach each other. As shown in FIG. 4A, in the steady state (state in which both of the driving electrodes 21 and 22 separate from each other), a pull-in operating voltage is not applied, and the fixed driving electrode 21, the movable driving electrode 22, and the pair of spacers 25 have the same potential (reference potential).

As shown in FIG. 4B, in the approaching operation, the electrostatic actuator 4 controls the application power supply W to apply the prescribed pull-in operating voltage to the fixed driving electrode 21. Charges having different positive and negative electrodes are accumulated on the fixed driving electrode 21 and the movable driving electrode 22 by the application of the pull-in operating voltage, and the voltage difference results in the generation of an electrostatic force between both of the driving electrodes 21 and 22. Due to the electrostatic force thus generated, the movable driving electrode 22 descends against the restoration force of the beam 23 and moves from its separating position to approaching position with respect to the fixed driving electrode 21. That is, the movable driving electrode 22 approaches the fixed driving electrode 21. Thus, the electrostatic actuator 4 shifts from the steady state to the pull-in state.

As shown in FIG. 4C, in the pull-in state (in an approaching state in which both of the driving electrodes 21 and 22 approach each other), the movable driving electrode 22 comes in contact with the pair of spacers 25 at the approaching position to form a prescribed air gap between the fixed driving electrode 21 and the movable driving electrode 22. At this time, the movable driving electrode 22 and the spacer electrode portion 31, which come in contact with each other via the insulator portion 32, have the same potential (reference potential), and the fixed driving electrode 21 has prescribed potential according to the pull-in operating voltage since the prescribed pull-in operating voltage is continuously applied to the fixed driving electrode 21.

As shown in FIG. 4D, in the separating operation, the electrostatic actuator 4 controls the application power supply W to stop the application of the pull-in operating voltage. When the application of the pull-in operating voltage is stopped, the electrostatic force generated between both of the driving electrodes 21 and 22 is released. As a result, due to the restoration force of the beam 23, the movable driving electrode 22 ascends and moves from the approaching position to the separating position with respect to the fixed driving electrode 21. That is, the movable driving electrode 22 separates from the fixed driving electrode 21. Thus, the electrostatic actuator 4 shifts from the pull-in state to the steady state. Note that although "the application of the pull-in operating voltage is stopped" in the above description, zero potential is not necessarily required. That is, it may be configured such that the voltage applied to the fixed driving electrode 21 reduces to a level at which the electrostatic force generated with the application bows to the restoration force of the beam 23.

Second Embodiment

Next, a description will be given of a second embodiment with reference to FIGS. 5A and 5B. The second embodiment exemplifies an electric switch 41 using electrostatic actuators 4. As is the case with the first embodiment, the electric switch 41 is a MEMS device and configured in such a way that an electronic circuit and a mechanical structure are installed on a silicon substrate 2 using a semiconductor integrated circuit manufacturing technology.

Figure 5A:
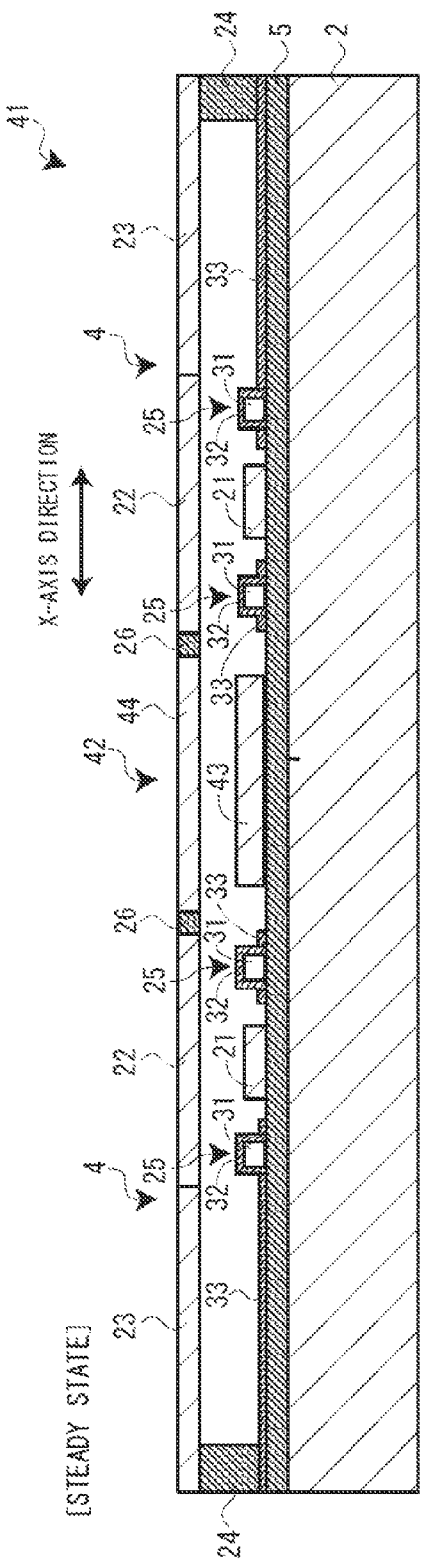
FIGS. 5A and 5B are cross-sectional views of an electric switch according to a second embodiment.
Figure 5B:
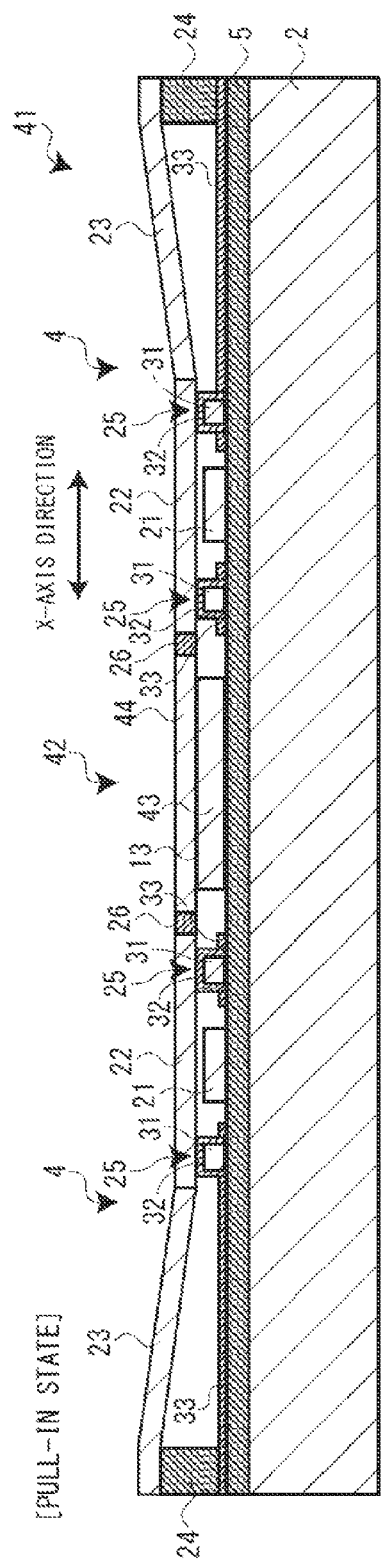

As shown in FIGS. 5A and 5B, the electric switch 41 has the silicon substrate 2, a switch element (switch) 42 that is disposed on the silicon substrate 2, and the pair of electrostatic actuators 4 that is disposed on the silicon substrate 2 and coupled to both sides of the switch element 42. That is, the electric switch 41 switch-drives the switch element 42 using the pair of electrostatic actuators 4 as a driving source. Note that the pair of electrostatic actuators 4 has the same configuration as those of the first embodiment and their description will be omitted here.

The switch element 42 has a fixation-side fixed switch electrode 43 that is laid on the silicon substrate 2 and a movable-side movable switch electrode 44 that faces the fixed switch electrode 43 from above. In addition, both of the switch electrodes 43 and 44 have the respective electric contacts (input terminals) of the switch element 42, and a current passes when both of the switch electrodes 43 and 44 come in contact with each other. Further, the movable switch electrode 44 is coupled to movable driving electrodes 22 of the pair of electrostatic actuators 4 on both sides thereof in an X-axis direction and approaches and separates from the fixed switch electrode 43 when the pair of movable driving electrodes 22 is driven. Thus, the switch-driving of the switch element 42 is performed by the passage and interruption of a current on the switch element 42.

According to the above configuration, a spacer electrode portion 31 of a spacer 25 (stopper) has the same potential as the movable driving electrode 22 in a pull-in state, whereby positive and negative charges are not accumulated (an electric field is not generated) between the movable driving electrode 22 and the spacer electrode portion 31 and charges are not accumulated on an insulator portion 32 interposed between the movable driving electrode 22 and the spacer electrode portion 31. As described above, charges are not accumulated on the spacer 25 itself as well as both of the driving electrodes 21 and 22, and thus stiction can be prevented by the simple configuration.

In addition, since a pull-in operating voltage is applied to the side of the fixed driving electrode 21, the potential of the movable driving electrode 22 does not change and a voltage is not required to be applied to the spacer electrode portion 31 of the spacer 25. Accordingly, the potential control can be easily performed.

Moreover, since the film thicknesses of the fixed driving electrode 21 and the spacer electrode portion 31 are made the same when the fixed driving electrode 21 and the spacer electrode portion 31 are formed to have the same height, the fixed driving electrode 21 and the spacer electrode portion 31 can be formed in an integrated process.

In addition, since the fixed driving electrode 21 and the movable driving electrode 22 face each other at the exposed parts thereof (parts exposed to an air gap) at which an insulating film 33 is not formed, stiction can be more reliably prevented with the avoidance of the accumulation of charges.

Note that in each of the above embodiments, it is configured such that the pair of spacers 25 is disposed so as to sandwich the fixed driving electrode 21 therebetween. However, each of the above embodiments is not limited to this configuration. For example, it may be configured such that each of the electrostatic actuators 4 has only one spacer 25. Furthermore, it may be configured such that the two electrostatic actuators 4 share one spacer 25.

In addition, in each of the above embodiments, it is configured such that the fixed driving electrode 21 and the movable driving electrode 22 face each other at the exposed parts thereof at which the insulating film 33 is not formed and that the fixed driving electrode 21 and the movable driving electrode 22 face each other via only the air gap. However, it may be configured such that the insulating film 33 is also formed on the fixed driving electrode and that the fixed driving electrode 21 and the movable driving electrode 22 face each other via the air gap and the insulating film 33 in the pull-in state.

Further, in each of the above embodiments, it is configured such that the movable driving electrode 22 and the spacer 25 are connected to the ground G and that the fixed driving electrode 21 is connected to the application power supply W. However, it may be configured such that the fixed driving electrode 21 is connected to the ground G and that the movable driving electrode 22 and the spacer 25 are connected to the application power supply W.

Furthermore, in each of the above embodiment, it is configured such that the movable driving electrode 22 and the spacer 25 have the same potential at all times. However, each of the above embodiments is not limited to this configuration if it is configured such that the movable driving electrode 22 and the spacer 25 have the same potential at least in the pull-in state. That is, it may be configured such that the movable driving electrode 22 and the spacer 25 have different potential in the steady state and at the time of shifting from the steady state to the pull-in state and have the same potential in the pull-in state. For example, it may be configured such that a voltage is applied to the spacer 25 only in the pull-in state when the movable driving electrode 22 and the spacer 25 are connected to the application power supply W.

Figure 6A:
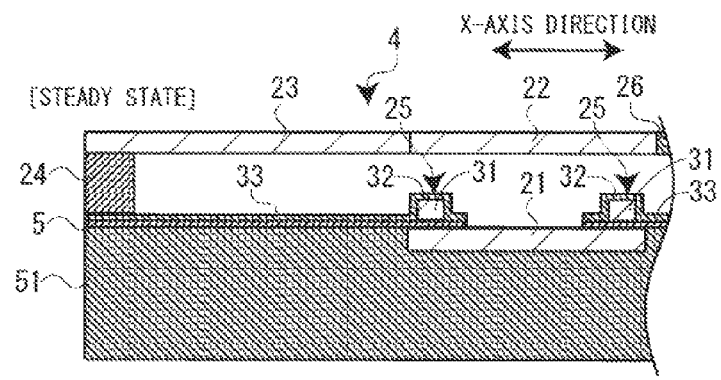
FIGS. 6A and 6B and FIGS. 6C and 6D are cross-sectional views of a first modified example of the electrostatic actuator and cross-sectional views of a second modified example thereof, respectively.
Figure 6B:
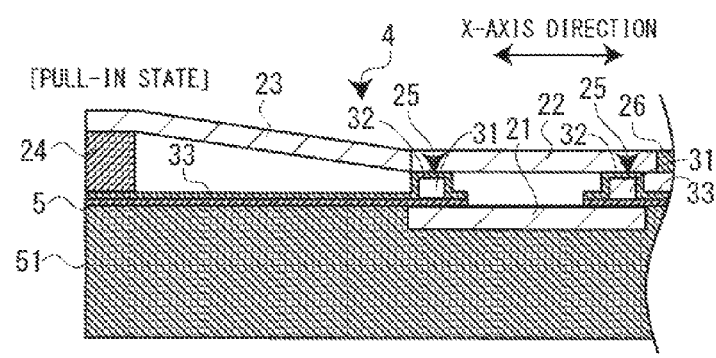
Figure 6C:
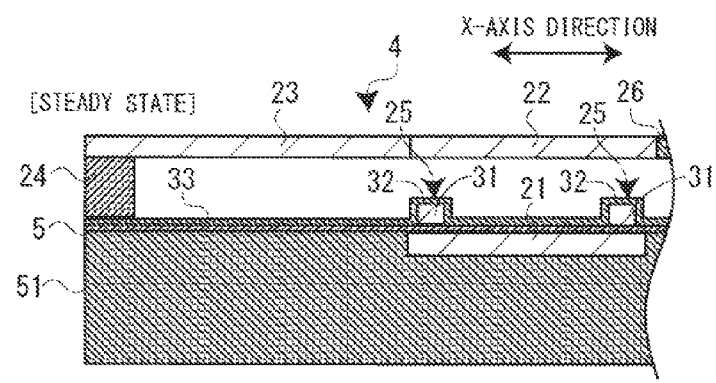
Figure 6D:
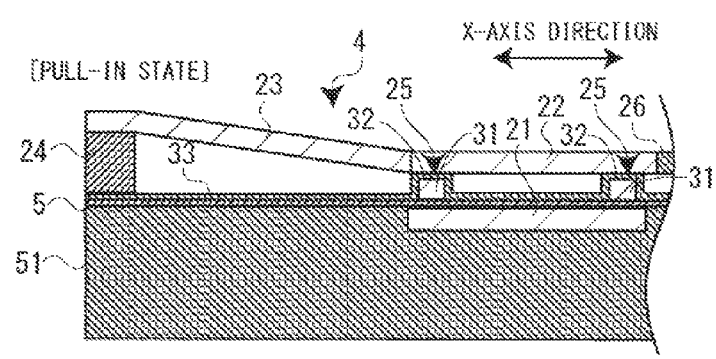

In addition, in each of the above embodiments, it is configured such that the fixed driving electrode 21 is laid on the silicon substrate 2 and that each of the spacers 25 is disposed on the silicon substrate 2. However, each of the above embodiments is not limited to this configuration. Specifically, as shown in FIGS. 6A to 6D, it may be configured such that the fixed driving electrode 21 is embedded and disposed in an insulator substrate 51 (beneath the insulating layer 5) and that each of the spacers 25 is disposed on the fixed driving electrode 21. In this case, the insulating layer 5 is interposed between the fixed driving electrode 21 and the spacer electrode portion 31 to bring the fixed driving electrode 21 and the spacer electrode portion 31 out of conduction. As described above, each of the spacers 25 is disposed so as to overlap with the fixed driving electrode 21 and interposed between the fixed driving electrode 21 and the movable driving electrode 22, whereby space in the length or width direction can be reduced. In addition, in this case, as shown in FIGS. 6A and 6B, it may be configured such that the insulating layer 5 and the insulating film 33 are formed so as to pass over a part at which both of the driving electrodes 21 and 22 face each other and that both of the driving electrodes 21 and 22 face each other at the exposed parts thereof via an air gap. Alternatively, as shown in FIGS. 6C and 6D, it may be configured such that the insulating layer 5 and the insulating film 33 are also formed at the part at which both of the driving electrodes 21 and 22 face each other and that both of the driving electrodes 21 and 22 face each other via the insulating layer 5, the insulating film 33, and the air gap.

Figure 7A:
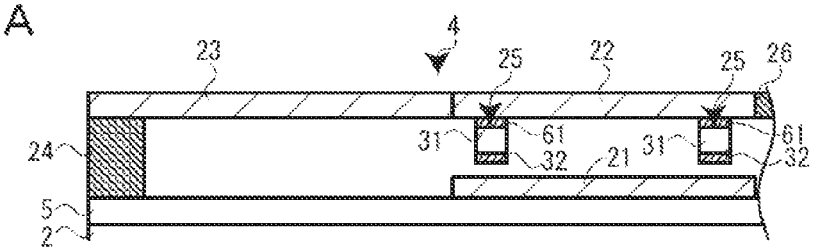
FIGS. 7A to 7E are a cross-sectional view of a third modified example of the electrostatic actuator, a cross-sectional view of a fourth modified example thereof, a cross-sectional view of a fifth modified example thereof, a cross-sectional view of a sixth modified example thereof, and a cross-sectional view of a seventh modified example thereof, respectively.
Figure 7B:
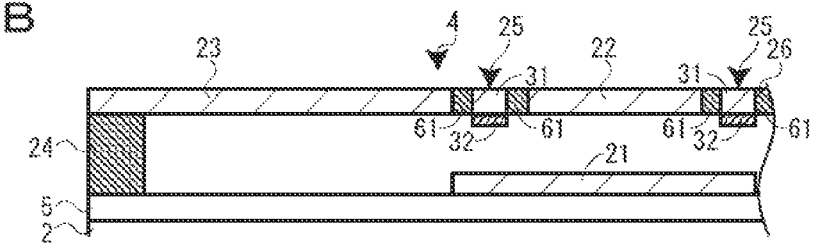
Figure 7C:
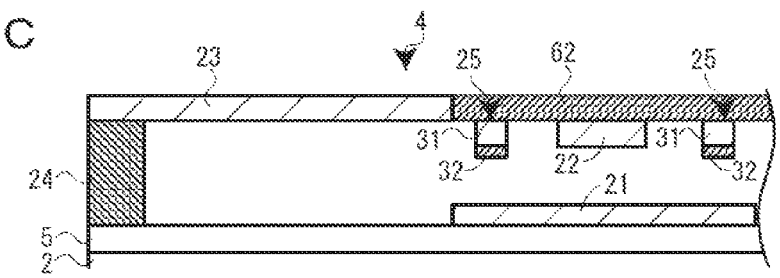

Moreover, in each of the above embodiments, it is configured such that the pair of spacers 25 is disposed on the silicon substrate 2 or the fixed driving electrode 21 (on the side of the fixed driving electrode 21). However, it may be configured such that the pair of spacers 25 is disposed on the side of the movable driving electrode 22. In this case, the pair of spacers 25 integrally moves with the movable driving electrode 22 and comes in contact with the fixed driving electrode 21 in the pull-in state to form the above prescribed air gap. Of course, it may be configured such that one of the pair of spacers 25 is disposed on the silicon substrate 2 or on the side of the fixed driving electrode 21 and that the other thereof is disposed on the side of the movable driving electrode 22. In addition, examples of the configuration in which the spacer 25 is disposed on the side of the movable driving electrode 22 include a configuration in which the spacer 25 is disposed on a part right beneath the movable driving electrode 22 via an insulating portion 61 (see FIG. 7A), a configuration in which the spacer 25 is coupled to the movable driving electrode 22 via the insulating portions 61 to be disposed (see FIG. 7B), and a configuration in which the movable driving electrode 22 is supported by a support member 62 and the spacer 25 is disposed on the support member 62 (see FIG. 7C). In the cases of such configurations, as shown in the figures, the fixed driving electrode 21 is formed to have a length enough to cover the movable driving electrode 22 and the pair of spacers 25 in the X-axis direction.

Figure 7D:
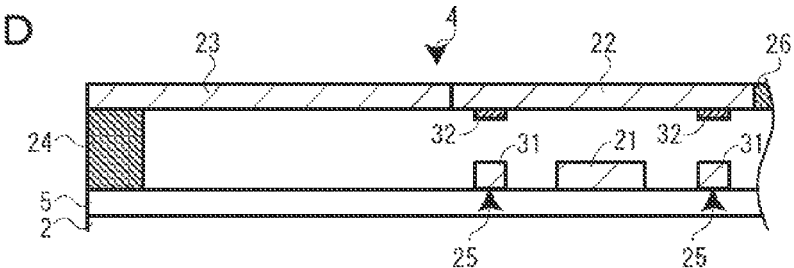
Figure 7E:
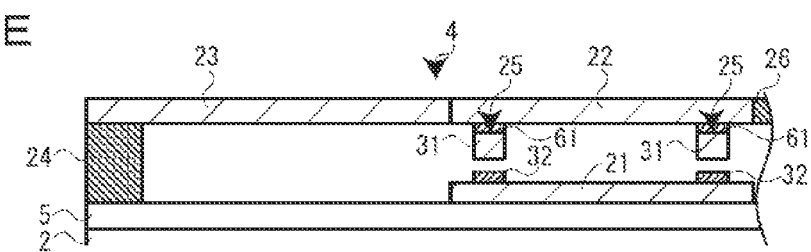

Furthermore, in each of the above embodiments, it is configured such that the insulator portion 32 and the spacer electrode portion 31 that comes in contact with one of the driving electrodes 21 and 22 via the insulator portion 32 are integrally disposed on one of the side of the fixed driving electrode 21 and the side of the movable driving electrode 22. However, it may be configured such that the spacer electrode portion 31 and the insulator portion 32 are separate bodies and disposed on the side of the fixed driving electrode 21 and the side of the movable driving electrode 22, respectively. For example, as shown in FIG. 7D, it may be configured such that the spacer electrode portion 31 is disposed on the silicon substrate 2 and that the insulator portion 32 is disposed on a part right beneath the movable driving electrode 22. Alternatively, as shown in FIG. 7E, it may be configured such that the spacer electrode portion 31 is disposed on a part right beneath the movable driving electrode 22 and that the insulator portion 32 is disposed on the silicon substrate 2. In these cases, each of the spacers 25 is formed of only the spacer electrode portion 31. That is, it is configured such that each of the spacers 25 (spacer electrode portion 31) comes in contact with the facing driving electrode 21 or 22 via the separate insulator portion 32.

REFERENCE NUMERALS

1: variable capacitance capacitor
2: silicon substrate
3: variable capacitance element
4: electrostatic actuator
21: fixed driving electrode
22: movable driving electrode
25: spacer
31: spacer electrode portion
32: insulator portion
41: electric switch
42: switch element
51: insulator substrate
G: ground
W: application power supply

What is claimed is:

1. An electrostatic actuator comprising:
    a fixed electrode that is disposed on a substrate;
    a movable electrode that is disposed so as to face the fixed electrode and approaches the fixed electrode with an electrostatic force generated between the movable electrode and the fixed electrode; and
    a spacer that comes in contact with one of the fixed electrode and the movable electrode in an approaching state in which the fixed electrode and the movable electrode approach each other and forms a prescribed air gap between the fixed electrode and the movable electrode, wherein
    the spacer has a spacer electrode portion that comes in contact with the one electrode via an insulator and has a same potential as the one electrode at least in the approaching state.

2. The electrostatic actuator according to claim 1, wherein the one electrode and the spacer electrode portion are connected to a reference potential point, and the other of the fixed electrode and the movable electrode is connected to an application power supply that applies a prescribed pull-in operating voltage to generate the electrostatic force.

3. The electrostatic actuator according to claim 1, wherein the spacer is disposed on the substrate and comes in contact with the movable electrode in the approaching state to form the prescribed air gap, and
the fixed electrode and the spacer electrode portion are formed to have a same height.

4. The electrostatic actuator according to claim 1, wherein the fixed electrode and the movable electrode face each other at exposed parts thereof.

5. A variable capacitance capacitor comprising:
the electrostatic actuator according to claim 1; and
a variable capacitance element that varies an electrostatic capacitance using the electrostatic actuator as a driving source.

6. An electric switch comprising:
the electrostatic actuator according to claim 1; and
a switch element that switch-drives using the electrostatic actuator as a driving source.

7. The electrostatic actuator according to claim 1, wherein the spacer is spaced apart from both the movable electrode and the fixed electrode in a state in which the fixed electrode and the movable electrode not in the approaching state.

8. A method for driving an electrostatic actuator including:
a fixed electrode that is disposed on a substrate,
a movable electrode that is disposed so as to face the fixed electrode and approaches the fixed electrode with an electrostatic force generated between the movable electrode and the fixed electrode, and
a spacer that has a spacer electrode portion that comes in contact with one of the fixed electrode and the movable electrode via an insulator in an approaching state in which the fixed electrode and the movable electrode approach each other, the spacer forming a prescribed air gap between the fixed electrode and the movable electrode, the one electrode and the spacer electrode portion being connected to a reference potential point, the method comprising:
applying a prescribed pull-in operating voltage to generate the electrostatic force to the other of the fixed electrode and the movable electrode.

9. An electrostatic actuator comprising:
a fixed electrode having a lower surface that is fixedly disposed on an upper surface of a substrate;
a movable electrode that is mounted spaced apart from the substrate, the movable electrode having a lower surface disposed so as to face the upper surface of the fixed electrode and the upper surface of the substrate;
wherein the lower surface of the movable electrode approaches the upper surface of the fixed electrode with an electrostatic force generated between the movable electrode and the fixed electrode; and
a spacer comprised of a spacer electrode portion covered by an insulator,
wherein, in a steady state, the spacer is spaced apart from one of the fixed electrode and the movable electrode,
wherein, in an approaching state in which the fixed electrode and the movable electrode approach each other, the spacer electrode comes into contact with the one of the fixed electrode and the movable electrode via the insulator, the spacer in the approaching state forming a prescribed air gap between the fixed electrode and the movable electrode, and
wherein the spacer electrode portion and the insulator have a same potential as the one electrode at least in the approaching state.

10. The electrostatic actuator according to claim 9, wherein the spacer is spaced apart from both the movable electrode and the fixed electrode in a state in which the fixed electrode and the movable electrode not in the approaching state.

* * * * *